United States Patent [19]

Heywang

[11] 4,087,716

[45] May 2, 1978

[54] MULTI-LAYER ELEMENT CONSISTING OF PIEZOELECTRIC CERAMIC LAMINATIONS AND METHOD OF MAKING SAME

[75] Inventor: Walter Heywang, Neukeferloh, Germany

[73] Assignee: Siemens Aktiengesellschaft, Berlin & Munich, Germany

[21] Appl. No.: 719,093

[22] Filed: Aug. 31, 1976

[30] Foreign Application Priority Data

Sep. 22, 1975 Germany .................. 2542228

[51] Int. Cl.$^2$ ................................ H01L 41/04
[52] U.S. Cl. ............................ 310/332; 310/359
[58] Field of Search ............... 310/8.1, 8.5, 8.6, 9, 310/9.5, 332, 359

[56] References Cited

U.S. PATENT DOCUMENTS

| Re. 27,116 | 4/1971 | Miller et al. | 310/9 |
| 2,976,501 | 3/1961 | Mattiat | 310/9 |
| 3,271,622 | 9/1966 | Malagodi et al. | 310/8.1 X |
| 3,474,268 | 10/1969 | Rudnick | 310/8.6 X |
| 3,590,287 | 6/1971 | Berlincourt et al. | 310/8.6 X |
| 3,958,161 | 5/1976 | Dixon | 310/9.5 X |

Primary Examiner—Mark O. Budd
Attorney, Agent, or Firm—Hill, Gross, Simpson, Van Santen, Steadman, chiara & Simpson

[57] ABSTRACT

A multi-layer element consisting of piezoelectric ceramic laminations possesses partially overlapping metal layers which are electrically connected to one another. Adjacent metal layers can each be connected to different poles of a voltage source, the laminations within the overlap zone of the metal layers being polarized in the thickness direction of the ceramic layers in such a manner that the polarization directions of adjacent laminations are opposite one another. All of the laminations of the multi-layer element exhibit a polarization outboard of the overlap zone in which the polarization is in the same direction.

1 Claim, 3 Drawing Figures

MULTI-LAYER ELEMENT CONSISTING OF PIEZOELECTRIC CERAMIC LAMINATIONS AND METHOD OF MAKING SAME

BACKGROUND OF THE INVENTION

1 Field of the Invention

The present invention relates to a multi-layer element, and its method of manufacture, which elements consist of piezoelectric ceramic layers and intermediate and external metal layers.

2. Description of the Prior Art

A multi-layer element of the type described above is known in the art and is utilized to operate a tartar removing device.

This type of multi-layer element has a plurality of laminations piezoelectric ceramic material. On the upper side of each layer and underneath each layer are metal layers which can be alternatively connected by way of end contacts to an ac voltage source. The ceramic layers are polarized in the direction of their thicknesses, the direction of polarization of adjacent layers being opposite to one another. This polarization is effected in that, following the production of the multi-layer element, a dc voltage of sufficient magnitude is connected to the metal layers. However, the polarization is effected only in that zone in which the metal layers overlap. This overlap zone does not extend over the entire area of the ceramic stack. Generally, the metal layers must not be allowed to occupy the entire area of the ceramic layers, as then, during operation of the element, it is not possible to achieve sufficient mutual electric insulation of the oppositely poled metal layers at the edges of the ceramic layers; in addition, breakdowns could occur at the edges of the plates.

During the polarization operation, the ceramic changes in geometric dimensions somewhat, so that in the region of the areas between the overlap regions and regions outboard of the overlap regions material strains occur which, in long-term oscillatory operation, can give rise to fractures.

SUMMARY OF THE INVENTION

It is the primary object of the present invention to provide an improved multi-layer piezoelectric ceramic structure, and method of producing the same, in which the resistance to fracture of the multi-layer elements of the type described, in long term operation, is greatly increased.

The above objective is achieved in a multi-layer element which is designed, according to the present invention, in that all of the ceramic layers of a multi-layer element have a polarization in the same direction in the thickness of the material outside of the zone of overlap of the metal layers.

The present invention is based on the recognition that the geometric dimensions of a body composed of piezoelectric ceramic are independent of whether the polarization occurs in one direction or in precisely the opposite direction.

BRIEF DESCRIPTION OF THE DRAWINGS

Other objects, features and advantages of the invention, its organization, construction and operation will be best understood from the following description taken in conjunction with the accompanying drawings, on which.

DESCRIPTION OF THE PREFERRED EMBODIMENT

Figure 1:
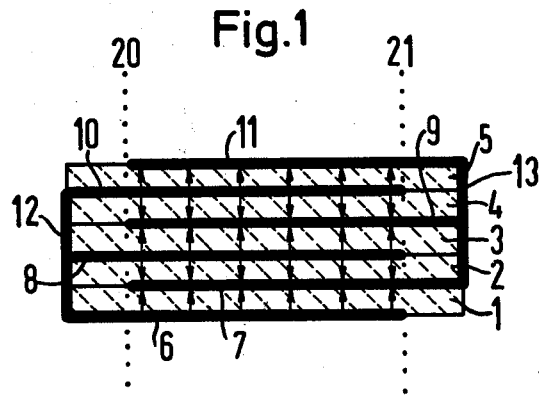
FIG. 1 is a sectional view of a known multi-layer element.

Referring first to FIG. 1, an example of a known multi-layer element is illustrated. This type of element possesses a plurality of laminations 1–5 consisting of piezoelectric ceramic material. On the upper side of each layer, and underneath each layer, are metal layers 6–11 which can be alternately connected, via connection contacts 12, 13, to an ac source. The ceramic layers are polarized, in the direction of their thickness, such that the direction of polarization of adjacent layers are opposite one another. This is symbolized in FIG. 1 by the arrows in the ceramic layers. The polarization is effected in that, following the production of the multi-layer element, a dc voltage of sufficient magnitude is connected to the metal layers. However, polarization is effected only in that zone in which the metal layers overlap. This overlap zone is bounded by the dotted lines 20 and 21. Generally, the metal layers must not be allowed to occupy the entire area of the ceramic layers as then, during the operation of the element it is not possible to achieve sufficient mutual electrical insulation of the oppositely poled metal layers at the edges of the ceramic layers; in addition, breakdowns could occur at the edges of the plates.

According to the present invention, first of all, for the production of the ceramic layers, appropriate starting materials are mixed together with a bonding agent, are cast to form foils, are dried and cut to the size of the desired ceramic layers. Then the foil components are fired, thus completing the production of the ceramic laminations.

Metalizations are applied to the ceramic layers in that metal pastes are applied by the silk screen printing technique which is known from the thick film technique, and, in fact, in a form provided for the particular application. The two ceramic layers which are arranged at the top and the bottom of the desired multi-layer stack are provided with a metal layer which covers the entire upper and lower surfaces, respectively. Now the ceramic layers, printed with the metal pastes, are stacked to form the desired multi-layer element and inserted into a furnace and the metal pastes are fired. The finished element appears, for example, as illustrated in FIG. 2.

Figure 2:
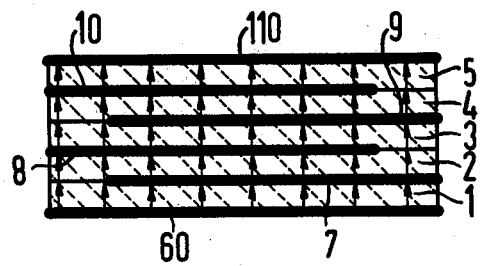
FIG. 2 is a sectional view of a multi-layer element constructed in accordance with the present invention after a first step of the polarization process employed in the invention.
Figure 3:
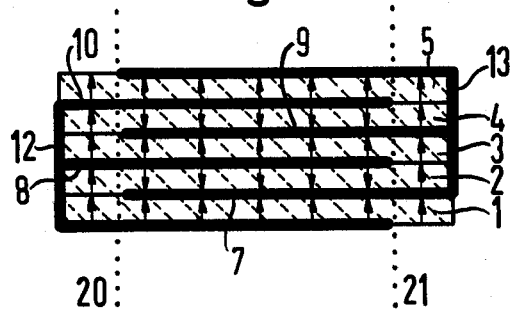
FIG. 3 illustrates the element of FIG. 2 after a second and last process step in the execution of the polarization according to the present invention.

The reference characters in FIG. 2 correspond to the reference characters in FIG. 1. The fundamental difference between the multi-layer element illustrated in FIG. 2 and the multi-layer element illustrated in FIG. 1 resides in the whole-area metal layers 60 and 110 on the surface and underneath the multi-layer element. The metal layers 60 and 110 are connected to a dc voltage which is such that an electric field strength which is sufficient for the polarization is produced within the ceramic layers. In the polarization of the process, the multi-layer element can be heated in an oil bath. Thus, all of the ceramic layers now possess a similarly directed polarization over the entire structure, as represented by the arrows illustrated on the drawing. The metal layers are electrically connected to each other, for example, by means of a conductive adhesive, so that successive metal layers can each be connected to different poles of a voltage source, i.e. the metal layers are electrically interconnected in the same way as already represented in FIG. 1. The metal layers 110 and 60 are etched away somewhat laterally so that they develop the same shape as the metal layers 6 and 11 in FIG. 1. The metal layers are again connected to a dc voltage which produces a field strength sufficient for polarization within the ceramic layers. This ensures that in every second layer within the zone in which the metal layers overlap (this zone again indicated by the dotted lines 20, 21) the direction of existing polarization is reversed. In this manner a multi-layer element corresponding to FIG. 3 is obtained in which, within the overlap region of the metal layers, adjacent laminations each exhibit mutually opposite polarization. Outside of the overlap region, in the outboard areas, all of the ceramic layers possess a polarization of similar direction.

Surprisingly, it has proved that no fractures form along the dotted lines 20, 21, although the direction of polarization of individual ceramic layers reverses in this zone.

In the finished multi-layer element, all of the ceramic layers possess an overall constant thickness, as each ceramic layer exhibits equal strength polarization virtually overall, and the reversal of the direction of the polarization of the individual ceramic layers does not result in any changes in thickness. Thus, no material stresses occur.

Although I have described my invention by reference to a particular illustrative embodiment thereof and method of its manufacture, other changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A multi-layer element comprising a plurality of piezoelectric ceramic layers stacked one upon the other including a first end layer and a second end layer, a plurality of metal layers, a first of said metal layers carried on the outer surface of said first end layer of the stack, a second metal layer carried on the outer surface of said second end layer of the stack, and the other metal layers intermediate said ceramic layers, alternate ones of said metal layers overlapping in a central portion of the stack, the stack having portions outboard of the overlapped portions, a first electrical connection between said first metal layer and some of said other metal layers, a second electrical connection between said second metal layer and the alternate metal layers between said some metal layers, adjacent piezoelectric layers polarized in opposite directions in the central portion of the stack, and all of said piezoelectric layers polarized in the same direction in the outboard portions of the stack.

* * * * *